United States Patent [19]

Okamoto et al.

[11] Patent Number: 4,894,576

[45] Date of Patent: Jan. 16, 1990

[54] SURFACE-ACOUSTIC-WAVE CONVOLVER

[75] Inventors: Takeshi Okamoto; Syuichi Mitsutsuka, both of Tokyo, Japan

[73] Assignee: Clarion Co., Ltd., Tokyo, Japan

[21] Appl. No.: 177,507

[22] Filed: Apr. 1, 1988

[30] Foreign Application Priority Data

Apr. 10, 1987 [JP] Japan ................................ 62-088548
Apr. 10, 1987 [JP] Japan ................................ 62-088549

[51] Int. Cl.$^{4}$ ............................................ H01L 41/08

[52] U.S. Cl. ............................ 310/313 D; 310/313 B; 364/821

[58] Field of Search ................ 310/313; 333/151, 153, 333/194, 195; 364/628, 821, 860

[56] References Cited

U.S. PATENT DOCUMENTS 3,753,164 8/1973 De Vries ........................ 310/313 D
3,818,379 6/1974 Wauk, II ..................... 310/313 D X
4,388,599 6/1983 Gautier et al. .................. 364/821 X
4,428,062 1/1984 Michaels ............................. 364/821
4,448,805 5/1984 Lewis .............................. 364/821 X
4,599,532 7/1986 Okamoto ........................ 310/313 D
4,675,839 6/1987 Kerr ............................... 333/154 X

OTHER PUBLICATIONS

Wideband Elastic Convolvers, by Gautier & Maerfeld, 1980 Ultrasonics Symposium Proceedings, Boston, MA, U.S.A., Nov. 5-7, 1980, pp. 30-36.

Broadband Amplitude and Phase-Compensating Transducers for Monolithic Convolvers, by Smith, 1980 Ultrasonics Symposium Proceedings, Boston, MA, U.S.A., Nov. 5-7, 1980, pp. 59-64.

*Primary Examiner*—Mark O. Budd
*Attorney, Agent, or Firm*—Flynn, Thiel, Boutell & Tanis

[57] ABSTRACT

A surface-acoustic-wave convolver includes a refraction means provided between two input electrodes to refract surface acoustic waves travelling from the respective input electrodes so as to suppress self-convolutions.

16 Claims, 8 Drawing Sheets

SURFACE-ACOUSTIC-WAVE CONVOLVER

FIELD OF THE INVENTION

This invention relates to a surface-acoustic-wave (hereinafter called "SAW") convolver, and more particularly to an improvement thereof for reducing its self-convolution.

BACKGROUND OF THE INVENTION

A great attention is directed recently to a spread spectrum communication system (hereinafter called "SSC system") as a new communication system. A receiver arrangement of such an SSC system must include a correlation function.

Since a SAW convolver has a correlation function and is operative as a programmable matched filter, it is one of the most important devices of an SSC.

The following three arrangements are proposed as a SAW convolver.

A separate-medium arrangement includes a semiconductor such as silicon and a piezoelectric film such as lithium niobate coupled to each other via a small gap.

An elastic arrangement includes input comb-shaped electrodes and an output gate electrode formed on a piezoelectric film such as lithium niobate to use an elastic non-linearity of the piezoelectric film.

A multi-layer arrangement includes a semiconductor such as silicon substrate on which a piezoelectric film such as zinc oxide is grown by a sputtering.

These three arrangements includes input electrodes and an output electrode. FIG. 18 is a plan view of an elastic arrangement, and FIG. 19 is a side elevation thereof. In FIGS. 18 and 19, reference numeral 1 refers to a lithium niobate or other piezoelectric substrate, 2 and 3 to input electrodes in the form of an aluminum or other metal film, 4 to an output electrode in the form of an aluminum or other rectangular metal film, and 8 and 9 to absorbers for attenuating undesired surface acoustic waves.

In FIGS. 18 and 19, an electric signal applied to terminals 5 and 6 of the input electrodes 2 and 3 is converted to SAW's which propagate from the electrodes 2 and 3 along the surface of the piezoelectric substrate 1. A SAW generated by the input electrode 2 travels to the right and to the left. However, since any undesired SAW reflected back by an end portion and travelling to the left is absorbed by the absorber 8, the arrangement can prevent any SAW travelling back to the right. Similarly, any rightwardly travelling SAW among SAW's travelling right and left is absorbed by the absorber 9.

That is, as shown in FIG. 20, SAW S1 from the input electrode 2 and SAW S2 from the input electrode 3 are conjoined via a nonlinear interaction so that a convolution output electric signal is extracted from an output terminal 7.

However, as shown in FIG. 21, when SAW S1 travels rightwardly from the input electrode 2 to the other input electrode 3, a component thereof is reflected back by the input electrode 3 and travels again to the left as SAW component S11. Similarly, when SAW 2 travels leftwardly from the input electrode 3 to the other input electrode 2, a component thereof is reflected back by the input electrode 2 and travels again to the right as SAW component S22.

As explained above, undesired convolution signals derived from a relative function between SAW S1 and SAW S11 and an interaction between SAW S2 and SAW S22 are outputted in addition to desired convolution signals between SAW S1 and SAW S2. These reflections are caused mainly by a so called re-emission and an acoustic impedance discontinuity. The re-emission is a phenomenum that SAW S1 and SAW S2, after travelling to the opposite input electrodes and converted to electric signals, are converted again to SAW's. The acoustic impedance discontinuity is caused by presence or absence of metal at the input electrode portions.

Since a SAW convolver in general has a small number of pairs of electrodes, the re-emission is the most important reason of the reflections. The convolutions between S1 and S11 and between S2 and S22 are called "Self-Convolutions" because they are convolutions by signals derived from themselves.

Since these self-convolutions are spurious signals, they deteriorate the SAW convolver characteristic.

The aforegoing phenomenum is immaterial when the input electrodes are unidirectional transducers because reflected components S11 and S22 are suppressed. However, an SSC requires a wide-band unidirectional transducer in order to deal with wide band signals. Although various narrow-band unidirectional transducers are proposed heretofore, wide-band unidirectional transducers have complicated arrangements, and it is difficult to cover necessary bands of an SSC sufficiently. Therefore, self-convolutions are usually present as shown in FIG. 21.

In order to suppress the self-convolution, I. Yao proposes a double track arrangement shown in FIG. 22 in "High Performance Elastic Convolver With Parabolic Horns" in 1980 Ultrasonics Symposium Proceedings, I. . . , Pages 37 to 42.

In FIG. 22, reference numerals 10 and 11 denote one pair of input electrodes, whereas 12 and 13 denote the other pair of input electrodes. Reference numeral 14 and 15 designate output electrodes whose outputs are sent to a balance-unbalance converter 18 to subsequently extract a total convolution output through 19. When a signal is applied to an input terminal 16, SAW's travel to the right in parallel relationships along two tracks corresponding to the input electrodes 10 and 11 and reach the opposite input electrodes 12 and 13. These entering SAW's, however, are opposite in phase at the input electrodes 12 and 13, and their sum output is produced at a terminal 17. Therefore, no electric signal derived from the SAW's is detected at the terminal 17, and no re-emission phenomenum occurs. Beside this, reflected components caused by the discontinuity of the acoustic impedance is deleted by the balance-unbalance converter 18. As a result, the total self-convolution is largely suppressed.

However, as shown in FIG. 22, since two output electrodes 14 and 15 are disposed in a parallel relationship, this arrangement requires an area double the arrangement of FIGS. 11 through 14. This necessarily increases the material cost and the dimension. Further, the use of the balance-unbalance converter 18 also increases the manufacturing cost and the entire dimension.

Although the aforegoing explanation is directed to the elastic arrangement, the separate-medium arrangement and multi-layer arrangement also include the same problems.

OBJECT OF THE INVENTION

It is therefore an object of the invention to provide a surface-acoustic-wave convolver having a simple, small-scaled and inexpensive self-convolution suppression means.

SUMMARY OF THE INVENTION

According to the invention, there is provided a surface-acoustic-wave convolver comprising:

a pair of input electrodes;

an output electrode for obtaining convolution signals of input signals applied to respective said input electrodes; and means provided between said input electrodes to refract surface acoustic waves travelling from respective said input electrodes.

According to a preferred embodiment of the invention, the refraction means is located between respective input electrodes and the output electrode. Alternatively, the refraction means may be made by configuring the output electrode in a parallelogram having one pair of opposed sides parallel to the travelling direction of surface acoustic waves generated by respective input electrodes and the other pair of opposed sides angled from the travelling direction.

Under this construction, the refraction means for refracting surface acoustic waves makes one of the input electrodes insensitive to surface acoustic waves travelling from the other input electrode thereto, and hence supresses the self-convolution.

DETAILED DESCRIPTION

Figure 1:
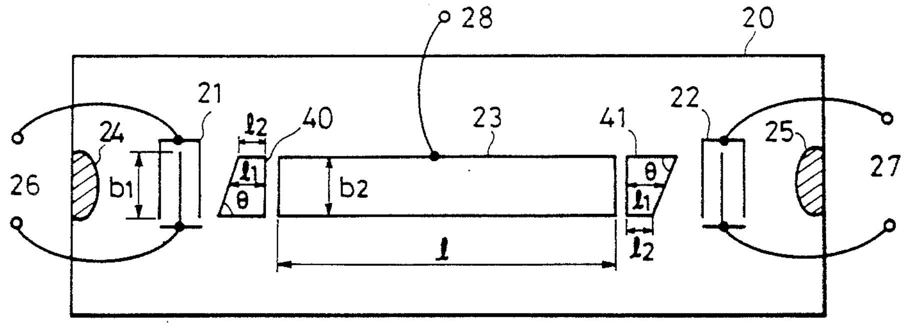
FIG. 1 is a plan view of a surface-acoustic-wave convolver according to the invention.

The invention is described below in detail, referring to preferred embodiments illustrated in the drawings.

FIG. 1 is a plan view of a surface-acoustic-wave convolver embodying the invention in which reference numeral 20 refers to a piezoelectric substrate, 21 and 22 to input transducers, 23 to an output electrode, 24 and 25 to surface-acoustic-wave absorbers, 26 and 27 to input terminals, 28 to an output terminal, 40 and 41 to trapezoid electrodes, $b_1$ to the interdigitating width of the input transducers, $b_2$ to the output electrode width, $\theta$ to an acute angle of the trapezoid electrodes, 1 to the length of the trapezoid electrodes, and 1 to the length of the bottom of each trapezoid electrode. Here, the trapezoid have two right angles at one side in the SAW travelling direction and one acute angle at the other side. The length of the trapezoid is one half of the sum of the upper and lower bottoms. Also when the upper bottom is short and the upper bottom is long, its generality is not lost. The trapezoid electrodes 40 and 41 are identical originally, but one of them is rotated by 180 degrees about the center of the output electrode 28. The output electrode is in the form of a rectangle having length 1 and width $b_2$.

In FIG. 1, input transducers 21 and 22 in the form of an aluminum or other metal film are provided on the lithium niobate or other piezoelectric substrate 20. Between the input transducers 21 and 22 are provided trapezoid electrodes 40 and 41 in the form of an aluminum or other metal film. Between the trapezoid electrodes and 41 is provided an output electrode 23 in the form of an aluminum or other metal film.

When the input terminals 26 and 27 connected to the input transducers 21 and 22 are supplied with electric signals:

$$F(t)\, e^{j\omega t}$$

$$G(t)\, d^{j\omega t}$$

where $\omega$: angular frequency the signals are converted to SAW's by the input transducers 21 and 22 and travel right and left, respectively. SAW's travelling leftwardly from the input transducer 21 toward one end of the piezoelectric substrate is removed by the absorber 24. Similarly, SAW's travelling rightwardly from the input transducer 22 is removed by the absorber 25.

Here below, consideration is directed to a SAW S1 travelling rightwardly from the input transducer 21 and a SAW S2 travelling leftwardly from the input transducer 22. These SAW's from the input transducers 21 and 22 can be expressed by:

$$S_1 = F\left(t - \frac{x}{v}\right)e^{j\omega(t-x/v)} \tag{1}$$

$$S_2 = G\left(t + \frac{x}{v}\right)e^{j\omega(t+x/v)}$$

where x is a travelling distance of each surface acoustic wave, and v is the velocity thereof.

If the trapezoid electrodes 40 and 41 are not present in FIG. 1, SAW's S1 and S2 pass by each other just below the output electrode 23, and as a result of their nonlinear interaction, an output expressed below is generated at the terminal 28 of the output electrode 23:

$$H(t) = \int_0^1 F(t - x/v)e^{j\omega t(t-x/v)} \cdot G(t + x/v)e^{j\omega t(t+x/v)}\, dx = Ce^{j2\omega t} \int F(\tau)G(2t - \tau - t_0)d\tau \tag{2}$$

where $t_0 = (1/v)$ 1: output electrode length, and C: constant.

Therefore, a convolution signal between the input signals F(t) and G(t) is obtained at the output terminal 28.

Figure 2:
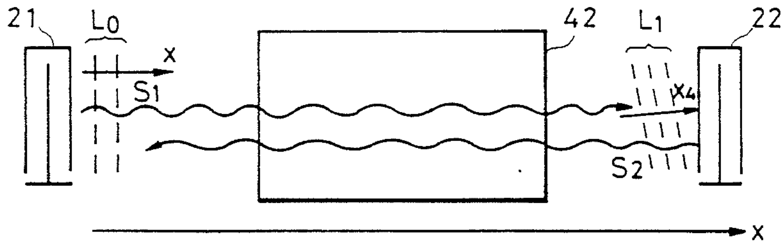
FIGS. 2 through 8 are plan views for explanation of functions of the inventive surface-acoustic-wave convolver.

FIG. 2 shows the principle of self-convolution suppression which is a major object of the invention. Assume here that $L_0$ exhibits the wave surface of SAW S1 while travelling to the right until entering a black box 42, X is a travelling distance of SAW S1, $L_1$ is the wave surface of SAW S1 while travelling through the black box 42 until entering in the input transducer 22, $X_4$ is the travelling direction of SAW S1, and as shown in FIG. 2, the black box 42 has a function of including the wave surface $L_1$ and the SAW travelling direction with respect to the X axis. The input transducer 22 and its periphery are shown in an enlarged view of FIG. 3.

Figure 3:
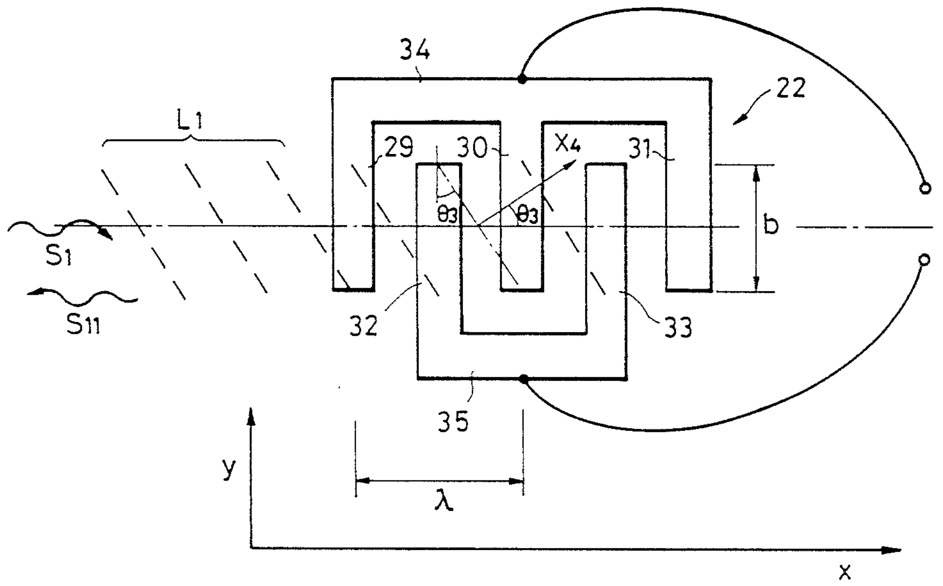

The transducer 22, as shown in FIG. 3, is a comb-shaped electrode in which an electrode 34 including teeth 29, 30 and 31 is interdigitated with an electrode 35 having teeth 32 and 33.

The SAW S1 has an inclination $\theta 3$ with respect to the X-axis direction, and similarly, the wave surface $L_1$ has the same inclination $\theta 3$ with respect to the length direction of teeth 29 through 33, i.e. with respect to the Y-axis direction.

When the inclined wave surface enters in the comb-shaped electrode, it is detected by the transducer 22, and the magnitude of the electric signal generated at the terminal 27 decreases as compared to the case of $\theta 3=0$. Particularly when the inclination $\theta 3$ is larger than $\lambda/2$ within the interdigitating width b of the transducer, i.e. when it satisfies expression (3), the electric signal generated at the terminal 27 is very small. Therefore, the transducer 22 is not sensitive to the surface acoustic wave S1 and allows it to pass therethrough and be absorbed by the absorber 25 of FIG. 1.

$$\tan \theta_3 \geqq (\lambda/2b_1) \quad (3)$$

where $\lambda$ is the wavelength of the surface acoustic wave.

Therefore, the reflected wave S11 caused by a re-emission which is a major reason of reflections at the input electrode is very small.

The aforegoing explanation is directed to re-emission. However, concerning a reflected component caused by the discontinuity of the acoustic impedance, the reflected component is inclined as the wave surface $L_1$ inclines. Therefore, the self-convolution caused by the reflected waves occurs between signal components having wave surfaces which are not parallel to each other, and it is suppressed largely. Beside this, reflected waves partly exit to the exterior of the region of the output electrode 23, the self-convolution is further suppressed. Additionally, by arranging the input electrodes 21 in the form of double electrode structure, reflected waves caused by the discontinuity of the acoustic impedance is further suppressed. Therefore, the self-convolution between signal S1 and reflected wave S11 from the transducer 22 are diminished significantly.

The aforegoing explanation is directed to SAW S1 from the input transducer 21. This is also valid to SAW S1 from tee input transducer 22. Therefore, in order to suppress self-convolutions, the black box 42 should have a means by which the direction of the wave surface of SAW travelling from one of the transducers to the other transducer through the black box 42 satisfies expression (3).

The black box 42 is made as follows.

Figure 4:
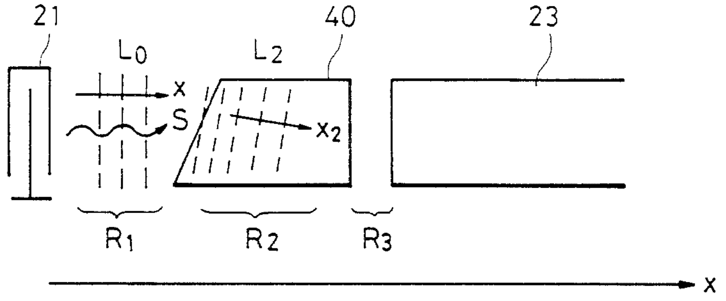

In FIG. 1, SAW's S1 and S2 from the input transducers 21 and 22 enter in the trapezoid electrodes 40 and 41. Since the trapezoid electrodes 40 and 41 have an inclination $\theta$, the surface wave of SAW are inclined. In order to explain this, FIG. 4 shows SAW S1 travelling from the input transducer 21 and entering in the trapezoid electrode 40 in an enlarged view.

Figure 5:
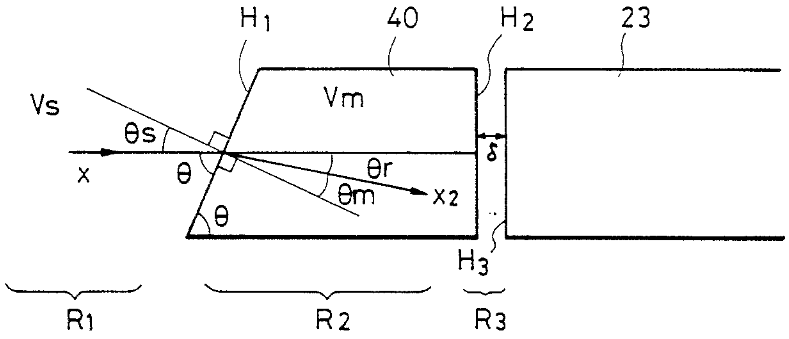

Assuming that SAW S1 travels in the X-axis direction on a free surface (region R1) of the piezoelectric substrate 20 before entering in the trapezoid electrode 40, the wave surface $L_0$ of SAW S1 is perpendicular to the X-axis direction. However, when SAW S1 enters in the trapezoid electrode 40, its wave surface is inclined to exhibit a wave surface L2 as shown in FIG. 4. Responsively, the travelling direction of SAW is changed to X2. This refraction of SAW is caused by a difference between the phase velocity vs of SAW on the free surface and the phase velocity thereof on the metal portion. Referring to FIG. 5, when $\theta$ refers to the inclination of the trapezoid electrode 40 in the X-axis direction, $\theta$s to the incident angle against one end surface H1 of the trapezoid electrode 40, and $\theta$m to the refraction angle, the following equation (4) is established according to the refraction law:

$$\frac{\sin \theta s}{v s} = \frac{\sin \theta m}{v m} \quad (4)$$

where vs: phase velocity of SAW on the free surface vm: phase velocity of SAW on the metal portion (trapezoid electrode).

Further, from FIG. 5, the following equations (5) and (6) are established:

$$\theta s = \frac{\pi}{2} - \theta \quad (5)$$

$$\theta r = \frac{\pi}{2} - (\theta m + \theta) \quad (6)$$

where $\theta$r: angle of X2 with respect to the X-axis.

Therefore, when SAW incides to the end surface H1 of the trapezoid electrode 40 having the inclination $\theta$, the travelling direction of SAW inclines by $\theta$r. When $K^2$ indicates the electromechanical coefficient of the piezoelectric substrate, the following equation is established:

$$k^2 = 2 \cdot \frac{v s - v m}{v s} \quad (7)$$

Therefore, the refraction of SAW is determined by $\theta$ and $K^2$.

Figure 6:
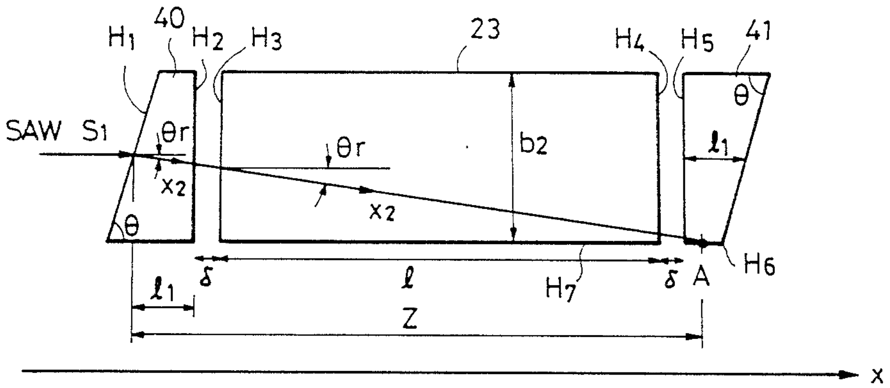

In FIGS. 4 and 5, SAW once refracted by the end surface H1 of the trapezoid electrode 5 is refracted twice and thrice by the other end surface H2 of the trapezoid electrode 40 and by one end surface H3 of the output electrode 23. Surfaces H2 and H3, however, are perpendicular to the X-axis direction. The region R3 between the trapezoid electrode 40 and the output electrode 23 is the free surface of the piezoelectric substrate, and its length is $\delta$. In this fashion, SAW S1 enters in the output electrode 23. This is shown in FIG. 6. SAW S1 which entered in the output electrode 23 travels in X2 direction, and its wave surface is parallel to L2 shown in FIG. 5. SAW S1 is further refracted by the other end surface H4 of the output electrode 23 and by one end surface H5 of the other trapezoid electrode 41, and reaches a point A of the other end surface H6 of the trapezoid electrode 41 parallel to the X-axis direction. These end surfaces H4 and H5 are perpendicular to the X-axis direction, and the distance therebetween is $\delta$.

FIG. 6 shows the point A as being on the end surface H6 of the trapezoid electrode 41. This is one of important factors which will be explained later.

Here, the distance Z between H1 to point A is calculated. It should be noted here that the length 6 between the trapezoid electrode 40 or 41 and the output electrode 23 is disregarded because it is significantly small as compared to the length $l_1$ of the trapezoid electrode 40 or 41 and the length 1 of the output electrode 23. That is:

$$\delta << l_1 \qquad (8)$$
$$\delta << l$$

In view of FIG. 6, Z is expressed by:

$$Z = \left(\frac{b_2}{2}\right) \cdot \left(\frac{1}{\tan\theta r}\right) \qquad (9)$$

The point A exists on the end surface H6 of the trapezoid electrode 41, and the end surface H6 is the upper bottom of a trapezoid having length $l_2$. Therefore, the following condition is required for the point A to exist on the end surface H6:

$$l + l_1 < Z < l + l_1 + l_2 \qquad (10)$$

By combining equations (4) through (7) and (9) with expression (10), the following expression (11) is obtained:

$$l + l_1 < (b_2/2)\tan[\theta + \sin^{-1}\{(1 - k^2/2)\cos\theta\}] < l + l_1 + l_2 \qquad (11)$$

Since SAW may be regarded as being sufficiently approximate to a planar wave, the following explanation is made in the assumption that SAW is a planar wave.

Figure 7:
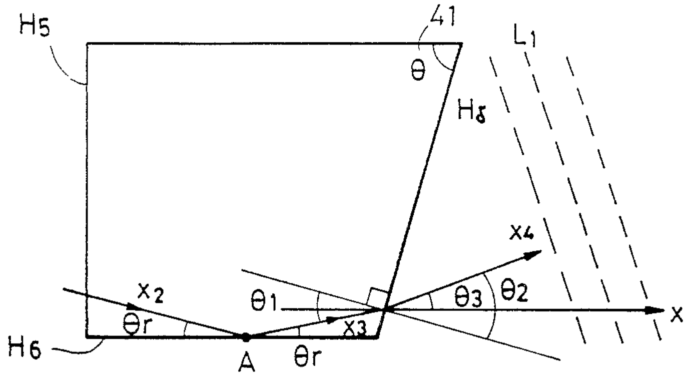

In FIG. 6, assume that SAW S1 is entirely reflected at point A. Referring to FIG. 7, conditions for the total reflection are:

$$v m < v s \qquad (12)$$

and $$\frac{\pi}{2} - \theta r > \sin^{-1}\left(\frac{v m}{v s}\right) \qquad (13)$$

Expression (12), however, is generally established for any SAW.

As shown in FIG. 7, SAW entirely reflected at point A travels in X3 direction, and, after refracted by an end surface H8 of the trapezoid electrode, it travels further, having the wave surface L1 along X4 direction. $\theta 1$ and $\theta 2$ are incident and refraction angles with respect to the end surface H8, and the following equations are established:

$$\frac{\sin\theta 1}{v m} = \frac{\sin\theta 2}{v s} \qquad (14)$$

$$\theta 1 = \frac{\pi}{2} + \theta r - \theta \qquad (15)$$

-continued $$\theta 3 = \theta 2 + \theta - \frac{\pi}{2} \qquad (16)$$

By combining equations (14) through (16) and (7), the following equation is obtained:

$$\theta 3 = \theta - \frac{\pi}{2} + \sin^{-1}\left\{\frac{\cos(\theta r - \theta)}{(1 - k^2/2)}\right\} \qquad (17)$$

Therefore, necessary conditions for supressing self-convolutions are obtained. That is, from equations (3) and (17), the following expression is obtained:

$$\frac{-l}{\tan\left\{\theta + \sin^{-1}\frac{\cos(\theta r - \theta)}{(1 - k^2/2)}\right\}} \geqq \frac{\lambda}{2b_1} \qquad (18)$$

From equations (4) through (7) and (13), $\theta$r in expression (18) is expressed by:

$$\theta r = \frac{\pi}{2} - \theta - \sin^{-1}\left\{\left(1 - \frac{k^2}{2}\right)\cos\theta\right\} < \frac{\pi}{2} - \sin^{-1}\left(1 - \frac{k^2}{2}\right) \qquad (19)$$

The aforegoing explanation is directed to SAW S1 travelling from the input transducer 21 to the right. The entirely same operation is done also when SAW S2 travels from the other input transducer 22 to the left. Therefore, self-convolutions are suppressed by satisfying expressions (18) and (19) in both cases.

Referring to FIG. 6, it is explained below why the total reflection point A must be located on the end surface H6 of the trapezoid electrode 41.

Figure 8:
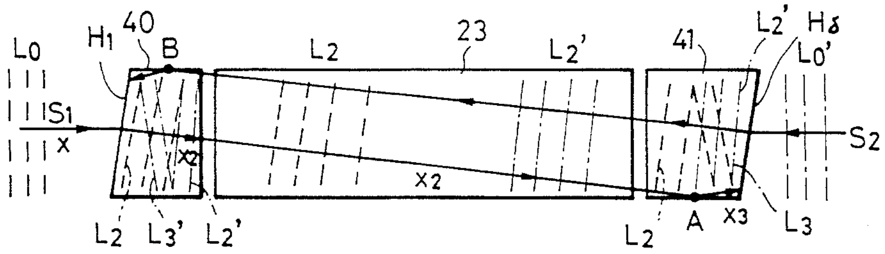

FIG. 8 shows wave surfaces of SAW S1 and S2 from input transducers 21 and 22. Broken lines $L_0$, $L_2$ and $L_3$ indicate wave surfaces of SAW S1 whereas dot-and-dash lines $L_0'$, $L_2'$ and $L_3'$ are wave surfaces of SAW S2. $L_0$ and $L_0'$ show wave surfaces before incidence to trapezoid electrodes 40 and 41, $L_2$ and $L_2'$ are wave surfaces of SAW's after refracted by end surfaces H1 and H8 of trapezoid electrodes 40 and 41 of FIG. 8, and $L_3$ and $L_3'$ are wave surfaces of SAW's S1 and S2 after entirely reflected.

As shown in FIG. 8, when the total reflection points exist within trapezoid electrodes 40 and 41, wave surfaces $l_2$ and $L_2'$ of S1 and S2 are parallel inside the output electrodes 23. Therefore, they exhibit an identical phase within the output electrode from which a convolution output should be extracted, and their integrations enforce with each other.

In contrast, wave surfaces of SAW's S1 and S2 are in a great turbulence within trapezoid electrodes 40 and 41. If convolution signals are detected in these regions, they have different phases and are not proper convolution signals. Therefore, trapezoid electrodes 40 and 41 are insulated from the output electrode 23.

If trapezoid electrodes 40 and 41 are connected to ground, electrical coupling between input transducers 21–22 and output electrode 23, i.e. a feedthrough phenomenum can be reduced.

If total reflection points A and B exist inside the output electrode 23, the turbulence of SAW's S1 and S2 produced inside the trapezoid electrodes 40 and 41 in FIG. 8 also appear inside the output electrode. Therefore, proper convolution signals are not obtained in the regions corresponding to the turbulent wave surfaces. Further, wave surfaces become parallel in a region of the output electrode. As far as this region is concerned, in-phase convolution signals are obtained. However, since the aforegoing turbulent signals are added to the in-phase signals, resulting convolution signals exhibit a larger turbulence.

When the total reflection points A and B exist neither inside the trapezoid electrodes nor inside the output electrode, expressions (18) and (19) defining conditions for suppressing self-convolutions are not established, and no improvement of the convolver characteristics is expected.

Therefore, the total reflection points A and B must exist inside the trapezoid electrodes. This is the condition defined by expression (11).

The aforegoing conditions are shown by a particular example.

A lithium niobate substrate is used as the piezoelectric substrate. Assume here that the input center frequency is 300 MHz, and the interdigitating width b1 of the input transducers and the width b2 of the output electrode are both 0.5 mm. That is:

$Kz^2=0.045$ $f=300$ MHz $\lambda=11.5$ μm $b1=b2=0.5$ mm

Figure 9:
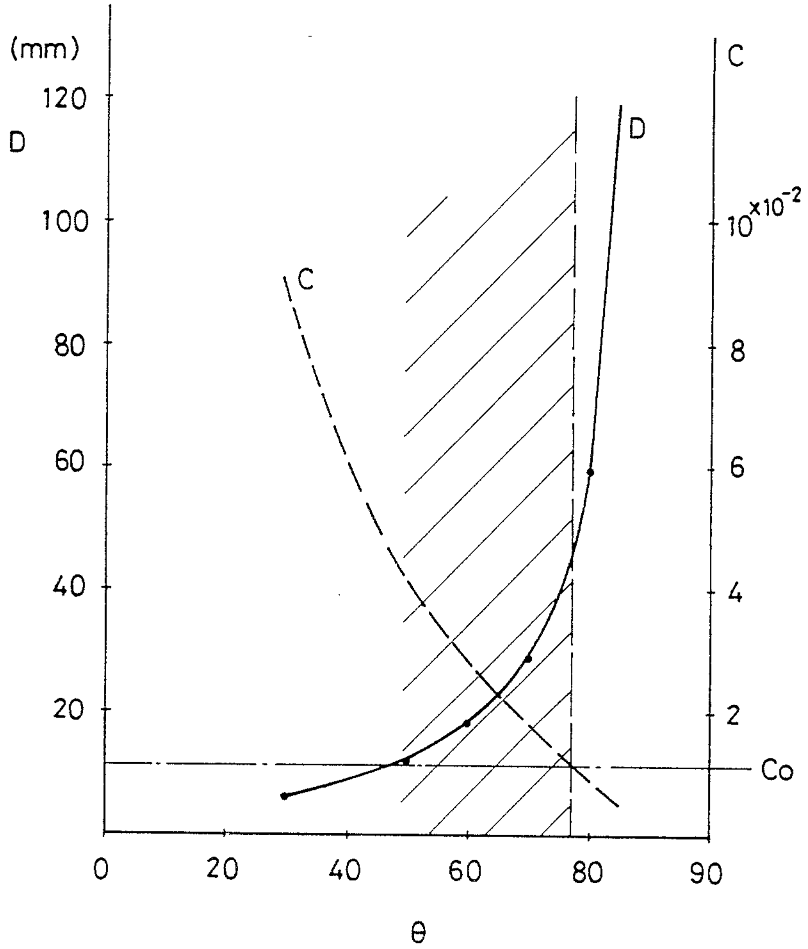
FIG. 9 is a graph showing acceptable inclinations of trapezoid electrodes used in the invention.

FIG. 9 shows a calculation result of expressions (11), (18) and (19) using the above-given particular data. In FIG. 9, C indicates the left entire term of expression (18), and $C_0$ shows the right entire term of same. D indicates the term sandwiched by inequality marks of equation (11).

Hatched lines in FIG. 9 shows the region satisfying expression (18). That is:

$\theta \lesssim 77°$ $D \lesssim 44$ mm

According to expression (11), the configuration of the trapezoid electrodes and the length of the output electrode are determined so as to satisfy $D \lesssim 44$ mm. Expression (19) is all satisfied within the calculation range of FIG. 9. As apparent from the particular example, conditions defined by expressions (1), (18) and (19) are immaterial in the practical use.

The aforegoing explanation has been directed to an elastic arrangement in which input transducers, output electrode and trapezoid electrodes are provided on a piezoelectric substrate. However, its resulting conditions shown in expressions (11), (18) and (19) are determined by the interdigitating width b1 of the input transducers, width b2 of the output electrode, length 1, angle $\theta$ of the trapezoid electrodes, lengths $1_1$ and $1_2$, wavelength $\lambda$ of a surface acoustic wave and electromechanical coupling coefficient $K^2$ of the piezoelectric substrate.

These are amounts which are commonly used in the other arrangements, i.e. the separate-medium arrangement and multi-layer arrangement. Therefore, expressions (11). (18) and (19) can be used in any arrangement.

Further, since no additional technology or electrical part is required to satisfy expressions (11), (18) and (19), the resulting convolver has a very simple arrangement.

Figure 10:
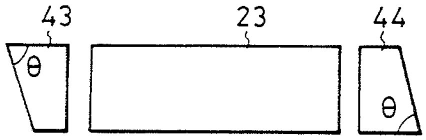
FIG. 10 gives plan views of two surface-acoustic-wave convolvers embodying the invention.
Figure 10:
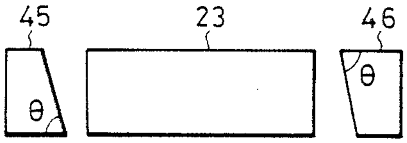

Apparently the same result is obtained by different dispositions of the trapezoid electrodes, i.e. by the arrangement of FIG. 10(*a*) in which the trapezoid electrodes have the same acute angle $\theta$ as FIG. 1 and are turned inside out, or by the arrangement of FIG. 10(*b*) in which the trapezoid electrodes have the same acute angle $\theta$ as FIG. 1 and their angled side edges are opposed to the output electrode.

Figure 11:
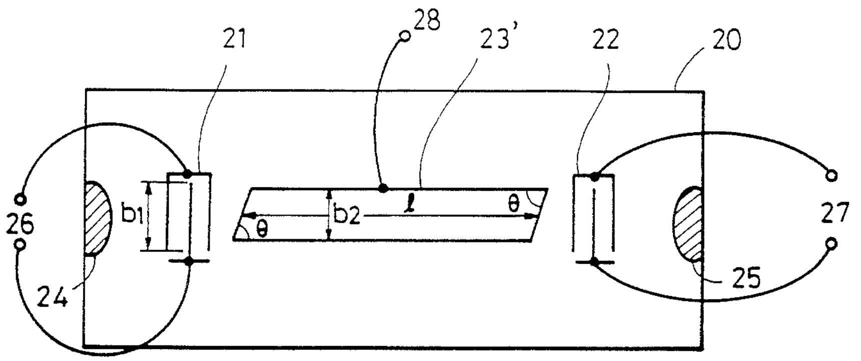
FIG. 11 is a plan view of a further embodiment of the invention.
Figure 12:
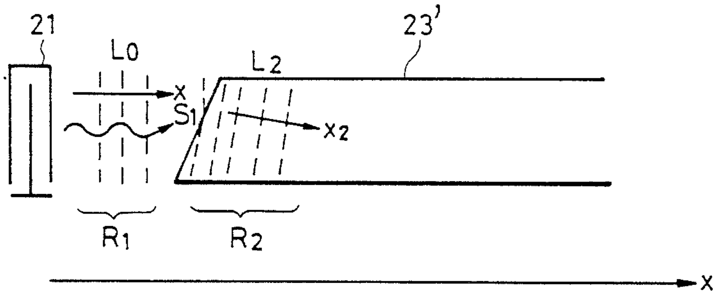
FIGS. 12 through 16 are plan views for explanation of functions of the embodiment of FIG. 11.
Figure 13:
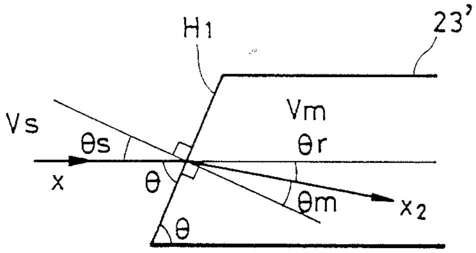

FIG. 11 is a plan view of a surface-acoustic-wave convolver which is a further embodiment of the invention in which the same reference numerals as used in FIG. 1 show identical or similar members. An output electrode 23' is in the form of a parallelogram having an angle $\theta$.

FIGS. through 16 are views for explaining principles of the operation of FIG. 11. Since the principles of self-convolution suppression of this embodiment is substantially identical to those of the embodiment of FIG. 1 as will be understood from comparison between FIGS. 12 through 16 and FIGS. 4 through 8, their detailed explanation is omitted, except some features different from the embodiment of FIG. 1.

Figure 14:
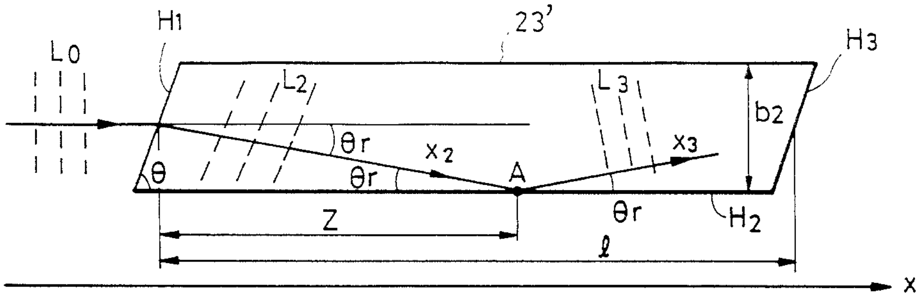
Figure 15:
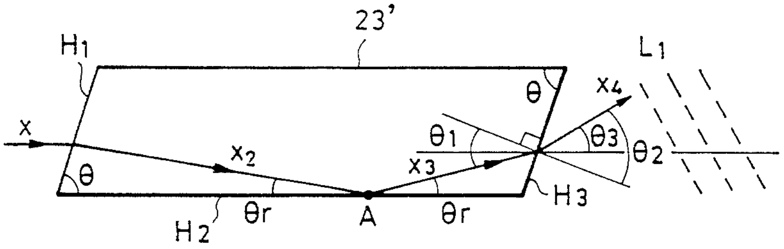

A refracted SAW travels through the output electrode region R2 and reaches the point A on the end surface H2 of the output electrode 23 parallel to the X-axis direction as shown in FIG. 14. When the distance in the X-axis direction between H1 to point A is indicated by Z, the following equation is established:

$$Z = \left(\frac{b_2}{2}\right)\cdot\left(\frac{1}{\tan\theta r}\right) \tag{20}$$

By incorporating expressions (4) through (7) into equation (20), the following equation is established:

$$Z=(b_2/2)\tan[\theta+\sin^{-1}\{(1-k^2/2)\cos\theta\}] \tag{21}$$

In order that point A exists inside the output electrode 23 having length 1, the following condition is required:

$$Z<1 \tag{22}$$

Figure 16:
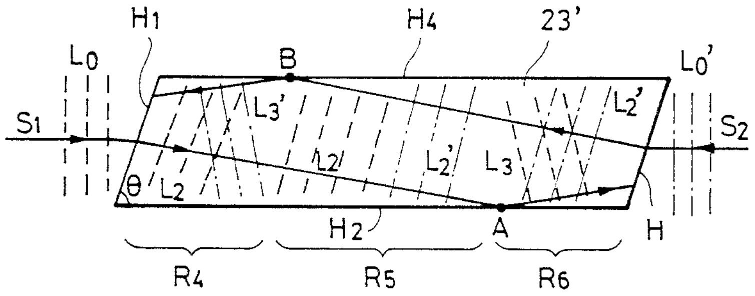

However, the embodiment of FIG. 11 has a problem. That is, since the wave surface of SAW inclines inside the output electrode 23 as shown in FIG. 14, this causes a drop in the level of a convolution signal resulting from essential SAW's S1 and S2. FIG. 16 shows wave surfaces of both SAW's S1 and S2 travelling from the input electrodes 21 and 22. Broken lines $L_0$, $L_2$ and $L_3$ show wave surfaces of SAW S1 whereas dot-and-dash lines $L_0'$, $L_2'$ and $L_3'$ are wave surfaces of SAW S2.

H1, H2, H3 and H4 indicate respective end surfaces of the parallelogram of the output electrode 23. B shows a point similar to point A but present on the end surface H4 for total reflection of SAW S2.

In FIG. 16, wave surfaces $L_2$ and $L_2'$ of SAW's S1 and S2 are parallel in the region R5 between points A and B. Therefore, convolution signals resulting from SAW S1 and SAW S2 are identical in phase in this region, and their integrations enforce with each other.

However, wave surfaces of SAW's S1 and S2 are not parallel in the region R6 in the right of point A and in the region R4 in the left of point B. Therefore, since convolution signals resulting from SAW's S1 and S2 are not identical in phase in regions R4 and R6, they cancel with each other to drop the entire convolution output.

In order to prevent such a drop in the essential convolution signals resulting from SAW's S1 and S2, it is necessary to locate the total reflection points A and B near the end surfaces H3 and H1 of the output electrodes 23 as far as possible as will be understood from FIG. 16.

This requirement is defined by the following expression in view of FIG. 14, equations (21) and (22):

$$Z \approx 1 \qquad (23)$$

That is, $$1 \approx (b_2/2)\tan[\theta + \sin^{-1}\{(1-k^2/2)\cos\theta\}] \qquad (24)$$

Therefore, necessary conditions for suppressing self-convolutions without dropping the essential convolution signal level are expressions (18), (19) and (24).

The aforegoing explanation has been directed to an elastic arrangement in which input transducers and output electrodes are provided on a piezoelectric substrate. However, obtained conditions (18), (19) and (24) are determined by the interdigitating width b1 of the input transducers, width b2 of the output electrode, length 1, angle $\theta$ of the parallelogram, wavelength $\lambda$ of the surface acoustic wave and electromechanical coupling coefficient $K^2$ of the piezoelectric substrate.

These are amounts commonly used in the other arrangements, i.e. separate-medium arrangement and multi-layer arrangement. Therefore, conditions (18), (19) and (24) may be used in any arrangement.

Further, since no additional technology or electrical part is required to satisfy expressions (18), (19) and (24), the convolver has a very simple structure.

Figure 17:
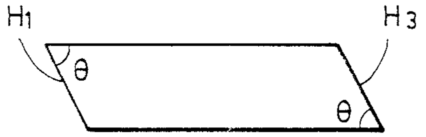
FIG. 17 is a plan view of a still further embodiment of the invention.
Figure 18:
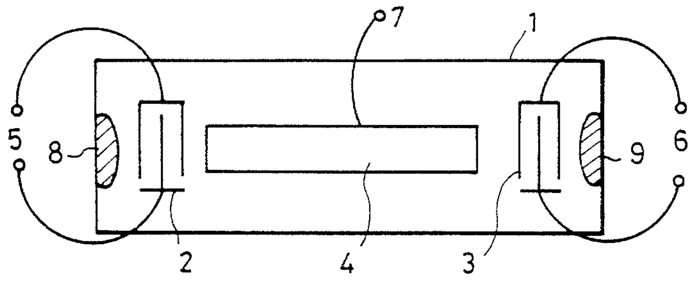
FIG. 18 PRIOR ART
FIGS. 18 and 19 are a plan view and a side elevation of a prior art surface-acoustic-wave convolver.
Figure 19:
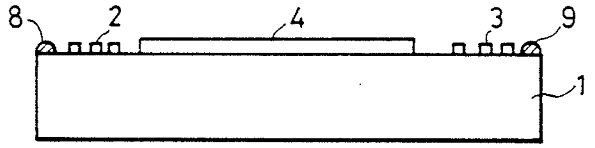
FIG. 19 PRIOR ART
Figure 20:
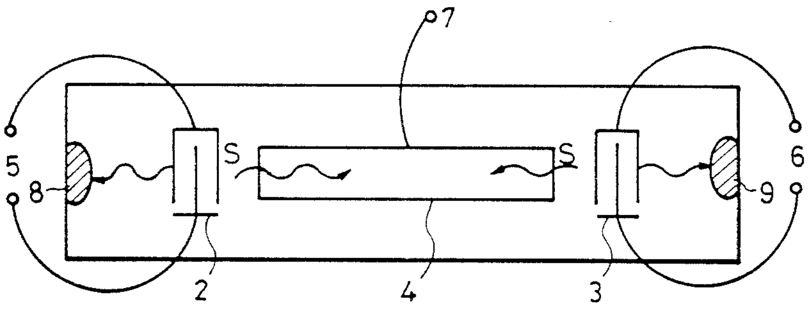
FIG. 20 PRIOR ART
FIGS. 20 and 21 are plan views for explanation of functions of the prior art convolver of FIGS. 18 and 19.
Figure 21:
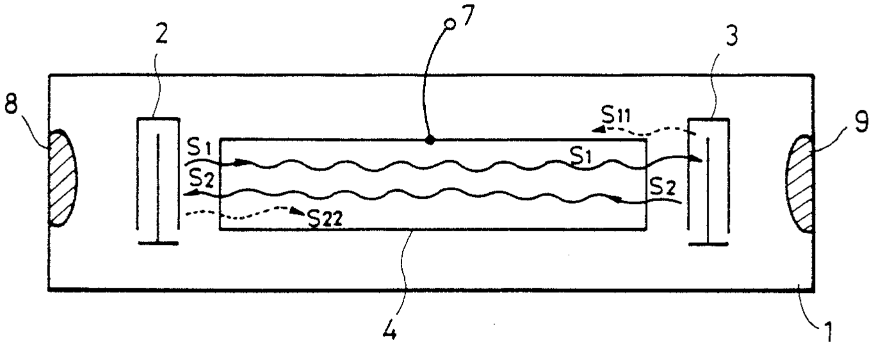
FIG. 21 PRIOR ART
Figure 22:
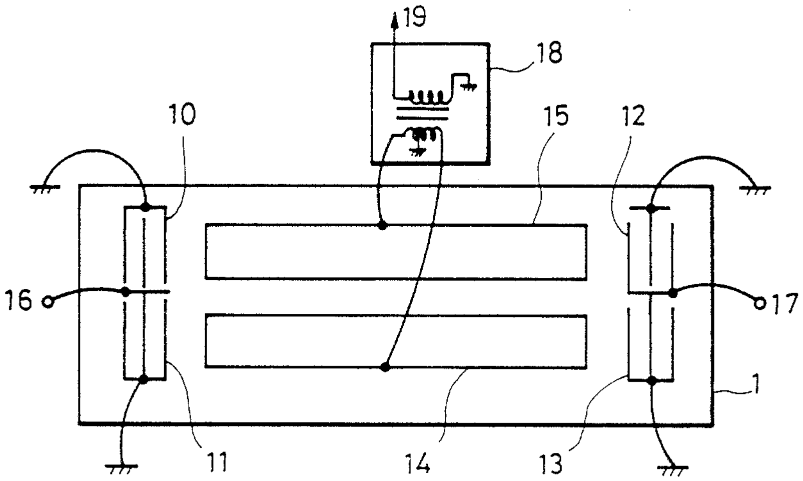
FIG. 22 PRIOR ART
FIG. 22 a plan view of a further prior art surface-acoustic-wave convolver.

Apparently the same result is obtained by configuring the parallelogram of the output electrode as shown in FIG. 17 in which its end surfaces H1 and H3 incline in the opposite direction to that of FIG. 16. It should be noted, however, that the angle of the parallelogram of FIG. 17 is the acute angle $\theta$ which is identical to that of FIG. 16.

As described above, the inventive SAW convolver can effectively suppress self-convolutions, and additionally, its arrangement is simple and its dimension is about a half of the prior art double track arrangement for the same purpose. This apparently contributes to a reduction of the manufacturing cost.

What is claimed is:

1. A surface-acoustic-wave convolver comprising:
- a pair of input electrodes;
- an output electrode for obtaining convolution signals of input signals applied to respective said input electrodes; and
- refraction means provided between said input electrodes to refract surface acoustic waves travelling from respective said input electrodes;
- wherein said refraction means is provided between each said input electrode and said output electrode; and
- wherein said refraction means includes a pair of trapezoid electrodes which are symmetrical about a center point of said output electrode.

2. A surface-acoustic-wave convolver according to claim 1 wherein said each trapezoid electrode has four corners, two of which at one side thereof in the travelling direction of a surface acoustic wave have a right angle, and one of the other two corners of which is an acute angle $\theta$ defined by:

$$\frac{-1}{\tan\left\{\theta + \sin^{-1}\frac{\cos(\theta r - \theta)}{(1 - k^2/2)}\right\}} \geqq \frac{\lambda}{2b_1}$$

$$\theta r = \frac{\pi}{2} - \theta - \sin^{-1}\left\{\left(1 - \frac{k^2}{2}\right)\cos\theta\right\} < \frac{\pi}{2} - \sin^{-1}\left(1 - \frac{k^2}{2}\right)$$

where
- $\mu$ is the wavelength of the surface acoustic wave, b1 is the interdigitating width of the input transducers, and
- $K^2$ is the electromechanical coefficient of a piezoelectric substrate.

3. A surface-acoustic-wave convolver according to claim 2 wherein each said trapezoid electrode has a configuration defined by:

$$l + l_1 < (b_2/2)\tan[\theta + \sin^{-1}\{(1 - k^2/2)\cos\theta\}] < l + l_1 + l_2$$

where
- 1 is the length of the output electrode,
- b2 is the width of the output electrode,
- $1_1$ is the one half of the sum of the upper and lower bottom length of the trapezoid electrode, and
- $1_2$ is the length of the upper bottom of the trapezoid electrode.

4. A surface-acoustic-wave convolver according to claim 2 wherein said acute angle is located at the outer side of each said trapezoid electrode.

5. A surface-acoustic-wave convolver according to claim 2 wherein said acute angle is located at the inner side of each said trapezoid electrode.

6. A surface-acoustic-wave convolver comprising:
- a pair of input electrodes;
- an output electrode for obtaining convolution signals of input signals applied to respective said input electrodes; and
- refraction means provided between said input electrodes to refract surface acoustic waves travelling from respective said input electrodes;
- wherein said refraction means includes said output electrode being a parallelogram having two opposed sides parallel to the travelling direction of surface acoustic waves from said input electrodes and having its other two opposed sides inclined with respect to said travelling direction so as to refract surface acoustic waves from said input electrodes; and
- wherein said other opposed sides of said output electrode make an angle $\theta$ defined by the following expression with respect to said travelling direction:

$$\frac{-1}{\tan\left\{\Theta + \sin^{-1}\frac{\cos(\Theta_r - \Theta)}{(1 - k^2/2)}\right\}} \geqq \frac{\lambda}{2b_1}$$

$$\Theta_r = \frac{\pi}{2} - \Theta - \sin^{-1}\left\{\left(1 - \frac{k^2}{2}\right)\cos\Theta\right\} <$$

-continued $$\frac{\pi}{2} - \sin^{-1}\left(1 - \frac{k^2}{2}\right)$$

where

λ is the wavelength o the surface acoustic waves, b1 is the interdigitating width of the input transducers, and $K^2$ is the electromechanical coupling coefficient of the piezoelectric substrate.

7. A surface-acoustic-wave convolver comprising:

a pair of input electrodes;

an output electrode for obtaining convolution signals of input signals applied to respective said input electrodes; and refraction means provided between said input electrodes to refract surface acoustic waves travelling from respective said input electrodes;

wherein said refraction means includes said output electrode being a parallelogram having two opposed sides parallel to the travelling direction of surface acoustic waves from said input electrodes and having its other two opposed sides inclined with respect to said travelling direction so as to refract surface acoustic waves from said input electrodes; and wherein said output electrode has a length 1 defined by:

$$1 \approx (b_2/2) \tan(\theta + \sin^{-1}\{(1-k^2/2)\cos\theta\})$$

where b2 is the width of the output electrode.

8. A surface acoustic wave convolver, comprising:

a piezoelectric layer;

an output electrode provided on said piezoelectric layer;

first means for causing first surface acoustic waves to travel through a portion of said output electrode in a first direction and for causing second surface acoustic waves to travel through said portion of said output electrode in a second direction substantially opposite said first direction; and second means for causing reflections of said first and second surface acoustic waves which enter said output electrode to be respectively travelling in third and fourth directions which form an angle with respect to said first and second directions;

wherein said second means includes first and second further electrodes provided on said piezoelectric layer on opposite sides of said output electrode, said first further electrode having an edge which is disposed in the path of said second surface acoustic waves leaving said portion of said output electrode and which is oriented so as to facilitate a substantially complete reflection of said second surface acoustic waves, and said second further electrode having an edge which is disposed in the path of said first surface acoustic waves leaving said portion of said output electrode and which is oriented so as to facilitate a substantially complete reflection of said first surface acoustic waves.

9. A convolver of claim 8, wherein said second further electrode reflects said first surface acoustic waves from travel in said first direction to travel in a fifth direction and said first further electrode reflects said second surface acoustic waves from travel in said second direction to travel in a sixth direction; and wherein said first means includes first and second transducers which are provided on said piezoelectric layer on opposite sides of said output electrode, said further electrodes each being located between said output electrode and a respective one of said input transducers, said first input transducer introducing into said piezoelectric layer said first surface acoustic waves which propagate away therefrom in a seventh direction oriented at an angle with respect to said sixth direction, said second input transducer introducing into said piezoelectric layer said second surface acoustic waves which propagate away therefrom in an eighth direction oriented at an angle with respect to said fifth direction, said first input transducer having a plurality of fingers extending substantially perpendicular to said seventh direction and said second input transducer having a plurality of fingers extending substantially perpendicular to said eighth direction.

10. A convolver of claim 9, wherein said seventh direction is substantially opposite to said eighth direction, wherein said output electrode has edges at opposite ends thereof which are perpendicular to said seventh and eighth directions, wherein each said further electrode has a second edge which is substantially perpendicular to said seventh and eighth directions, and wherein said further electrodes have third edges which are inclined with respect to said seventh and eighth directions and which respectively refract said first and second surface acoustic waves from respectively travelling substantially in said seventh and eighth directions to travel in said first and second directions, respectively.

11. A convolver of claim 10, wherein said fingers of said second and first transducers respectively produce reflections of said first and second surface acoustic waves travelling in said fifth and sixth directions, respectively, said reflections respectively travelling in ninth and tenth directions, and wherein said third edge of said second further electrode refracts said reflection of said first surface acoustic waves from travel in said ninth direction to travel in said third direction, and said third edge of said first further electrode refracts said reflection of said second surface acoustic waves from travel in said tenth direction to travel in said fourth direction.

12. A convolver of claim 10, wherein said second edge of each said further electrode is nearest said output electrode.

13. A convolver of claim 10, wherein said third edge of each said further electrode is nearest said output electrode.

14. A surface acoustic wave convolver, comprising: a piezoelectric layer; an output electrode provided on said piezoelectric layer; first means for causing first surface acoustic waves to travel through a portion of said output electrode in a first direction and for causing second surface acoustic waves to travel through said portion of said output electrode in a second direction substantially opposite said first direction; and second means for causing reflections of said first and second surface acoustic waves which enter said output electrode to be respectively travelling in third and fourth directions which form an angle with respect to said first and second directions;

wherein said output electrode has near respective ends thereof first and second edge portions, said second edge portion being in the path of said first surface acoustic waves leaving said portion of said output electrode and being oriented to facilitate a substantially complete reflection of said first surface acoustic waves from travel in said first direction to travel in a fifth direction, and said first edge portion of said output electrode being in the path of said second surface acoustic waves leaving said portion of said output electrode and being oriented to facilitate a substantially complete reflection of said second surface acoustic waves from travel in said second direction to travel in a sixth direction.

15. A convolver of claim 14, wherein said first means includes first and second input transducers provided on opposite sides of said output electrode, said first input transducer introducing into said piezoelectric layer said first surface acoustic waves which travel toward said output electrode in a seventh direction, and having a plurality of fingers extending substantially perpendicular to said seventh direction, and said second input transducer introducing into said piezoelectric layer said second surface acoustic waves which travel away therefrom in an eighth direction, and having a plurality of fingers extending substantially perpendicular to said eighth direction, said seventh and eighth directions being oriented at an angle with respect to said sixth and fifth directions, respectively.

16. A convolver of claim 15, wherein said seventh direction is substantially opposite said eighth direction, and wherein said output electrode is a parallelogram having parallel first and second edges at opposite ends thereof which are oriented at an angle with respect to said seventh and eighth directions and which facilitate refraction of said first surface acoustic waves from travel in said seventh direction to travel in said first direction and effect refraction of said second surface acoustic waves from travel in said eighth direction to travel in said second direction, said output electrode further having third and fourth edges which are each substantially parallel to said seventh and eighth directions and which each include a respective one of said first and second edge portions.

* * * * *

UNITED STATES PATENT AND TRADEMARK OFFICE

CERTIFICATE OF CORRECTION

PATENT NO. : 4 894 576

DATED : January 16, 1990

INVENTOR(S) : Takeshi OKAMOTO et al

It is certified that error appears in the above-identified patent and that said Letters Patent is hereby corrected as shown below:

Column 12, line 15; change "$\mu$" to ---$\lambda$---.

Column 13, line 8; "o" ---of---.

Signed and Sealed this

Twenty-first Day of January, 1992

*Attest:*

HARRY F. MANBECK, JR.

*Attesting Officer*

*Commissioner of Patents and Trademarks*